United States Patent
Mihai et al.

(10) Patent No.: US 10,818,523 B2
(45) Date of Patent: Oct. 27, 2020

(54) APPARATUS FOR DIVIDING WORKPIECE

(71) Applicant: DISCO CORPORATION, Tokyo (JP)

(72) Inventors: Chris Mihai, Santa Clara, CA (US); Kazuki Kaneoka, Tokyo (JP); Takushi Takahara, Tokyo (JP); Makoto Hirate, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/153,010

(22) Filed: Oct. 5, 2018

(65) Prior Publication Data
US 2019/0109023 A1    Apr. 11, 2019

(30) Foreign Application Priority Data
Oct. 11, 2017    (JP) .................... 2017-197829

(51) Int. Cl.
*H01L 21/67*    (2006.01)
*B28D 5/00*    (2006.01)
(Continued)

(52) U.S. Cl.
CPC ...... *H01L 21/67092* (2013.01); *B28D 5/0011* (2013.01); *B28D 5/0023* (2013.01); *B28D 5/0029* (2013.01); *B28D 5/0082* (2013.01); *B28D 5/0088* (2013.01); *H01L 21/67132* (2013.01); *H01L 21/681* (2013.01); *H01L 21/687* (2013.01); *H01L 21/6836* (2013.01); *H01L 2221/68327* (2013.01); *H01L 2221/68336* (2013.01)

(58) Field of Classification Search
CPC ............. H01L 21/67092; H01L 21/687; H01L 21/6836; H01L 21/67132; H01L 21/681; H01L 21/68; H01L 2221/68327; H01L 2221/68336; B28D 5/0011; B28D 5/0082; B28D 5/0023; B28D 5/0029; B28D 5/0088
See application file for complete search history.

(56) References Cited

U.S. PATENT DOCUMENTS

| 8,703,583 B2 * | 4/2014 | Maki | H01L 21/67092 257/E21.237 |
| 9,059,225 B2 * | 6/2015 | Kato | H01L 21/67092 |

(Continued)

FOREIGN PATENT DOCUMENTS

JP    2009148982 A    7/2009

*Primary Examiner* — Omar Flores Sanchez
(74) *Attorney, Agent, or Firm* — Greer Burns & Crain Ltd.

(57) ABSTRACT

A dividing apparatus divides a workpiece along projected dicing lines into chips, the workpiece being stuck to an upper surface of a protective tape mounted on an annular frame. The dividing apparatus includes a frame holding unit for holding the annular frame and a dividing unit for pressing the workpiece in the vicinity of one at a time of the projected dicing lines and dividing the workpiece into chips along the projected dicing line. The dividing unit includes a holder for holding a portion of the workpiece in the vicinity of the projected dicing line where the workpiece is to be broken, from both upper and lower surfaces of the workpiece, and a presser for pressing chips next to chips held by the holder across the projected dicing line where the workpiece is to be broken, thereby to divide the workpiece along the projected dicing line.

13 Claims, 4 Drawing Sheets

(51) Int. Cl.
*H01L 21/68* (2006.01)
*H01L 21/687* (2006.01)
*H01L 21/683* (2006.01)

(56) References Cited

U.S. PATENT DOCUMENTS

| | | | | |
|---|---|---|---|---|
| 9,786,490 | B2* | 10/2017 | Harada | H01L 21/3221 |
| 10,109,527 | B2* | 10/2018 | Oba | H01L 21/78 |
| 2004/0266094 | A1* | 12/2004 | Nagai | H01L 21/67092 |
| | | | | 438/232 |
| 2006/0084239 | A1* | 4/2006 | Nagai | B28D 5/0011 |
| | | | | 438/460 |
| 2009/0215246 | A1* | 8/2009 | Kitahara | C09J 5/06 |
| | | | | 438/463 |
| 2010/0047999 | A1* | 2/2010 | Hoshino | H01L 21/67092 |
| | | | | 438/463 |
| 2010/0055878 | A1* | 3/2010 | Maki | H01L 21/67092 |
| | | | | 438/464 |
| 2012/0247291 | A1* | 10/2012 | Kawada | C03B 33/0222 |
| | | | | 83/33 |
| 2012/0251791 | A1* | 10/2012 | Kawai | H01L 21/56 |
| | | | | 428/172 |
| 2014/0069588 | A1* | 3/2014 | Hirakawa | B32B 43/006 |
| | | | | 156/750 |
| 2014/0076500 | A1* | 3/2014 | Honda | H01L 21/6838 |
| | | | | 156/750 |
| 2015/0096964 | A1* | 4/2015 | Maeda | H01L 21/67092 |
| | | | | 219/121.84 |
| 2015/0357242 | A1* | 12/2015 | Nakamura | H01L 21/78 |
| | | | | 438/462 |
| 2015/0364375 | A1* | 12/2015 | Nakamura | H01L 21/268 |
| | | | | 438/462 |
| 2016/0133521 | A1* | 5/2016 | Munakata | H01L 21/561 |
| | | | | 438/462 |

* cited by examiner

APPARATUS FOR DIVIDING WORKPIECE

BACKGROUND OF THE INVENTION

Field of the Invention

The present invention relates to an apparatus for dividing a plate-shaped workpiece into chips by applying external forces thereto along projected dicing lines on the workpiece.

Description of the Related Art

Plate-shaped workpieces or substrates made of sapphire, SiC, glass, or the like are divided along projected dicing lines thereon into individual pieces. For dividing a workpiece, for example, a laser beam is applied to the workpiece along projected dicing lines thereon from a face side of the workpiece, forming modified layers along the projected dicing lines in the workpiece. After the modified layers have been formed, the workpiece is divided according to a three-point breaking process using a breaking apparatus having a blade or pressing member, as disclosed in Japanese Patent Laid-Open No. 2009-148982. According to the disclosed three-point breaking process, the blade presses the workpiece along the projected dicing lines where the mechanical strength is weak, dividing the workpiece into individual chips from the modified layers that act as division initiating points.

SUMMARY OF THE INVENTION

According to the three-point breaking process, both adjacent sides of a projected dicing line on the reverse side of the workpiece are supported at two points and the blade presses the face side of the workpiece on the projected dicing line from above, thus dividing the workpiece along the projected dicing line. Therefore, the chips disposed adjacent to the pressed projected dicing line tend to move away from the area where the projected dicing line is disposed, resulting in chippings produced from the edges of the chips.

It is therefore an object of the present invention to provide an apparatus for dividing a plate-shaped workpiece along projected dicing lines thereon while reducing chippings produced in chips into which the workpiece is divided.

In accordance with an aspect of the present invention, there is provided a dividing apparatus for dividing a plate-shaped workpiece along projected dicing lines thereon, the workpiece being stuck to an upper surface of a protective tape mounted on an annular frame and having a strength reduced along the projected dicing lines, including a frame holding unit having a holding surface for holding the annular frame, the frame holding unit being rotatable about its own axis, a detecting unit for detecting the projected dicing lines on the workpiece stuck to the protective tape, a dividing unit for dividing the workpiece into chips along the projected dicing line detected by the detecting unit, and a moving mechanism for moving the frame holding unit and the dividing unit with respect to each other. The dividing unit includes a holder for holding one of two regions of the workpiece which are next to each other across the detected projected dicing line where the workpiece is to be broken, from both upper and lower surfaces of the workpiece, and a presser for pressing an other of the two regions of the workpiece which is next to the one of the two regions that is held by the holder across the projected dicing line where the workpiece is to be broken, thereby to divide the workpiece along the projected dicing line.

With the above arrangement, while one of the two regions of the workpiece which are next to each other across the detected projected dicing line where the workpiece is to be broken is being held from both the upper and lower surfaces of the workpiece by the holder, the other of the two regions is pressed by the presser. The region held by the holder is prevented from being moved by the presser pressing the other region, thereby preventing chippings from being produced from edges of the chips.

In the dividing apparatus according to the present invention, the holder includes a first holder for pushing upwardly the workpiece from the lower surface thereof through the protective tape, and a second holder disposed above the workpiece in facing relation to the first holder across the workpiece, for abutting and holding the workpiece from above the workpiece. The first holder has a plurality of rectangular abutment members of different lengths, the first holder being operable to position one of the rectangular abutment members which has a length corresponding to the length of the projected dicing line.

According to the present invention, since while one of the two regions of the workpiece which are next to each other across the detected projected dicing line is being held from both the upper and lower surfaces of the workpiece by the holder, the other of the two regions is pressed by the presser to divide the workpiece, chippings are prevented from being produced from edges of the chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
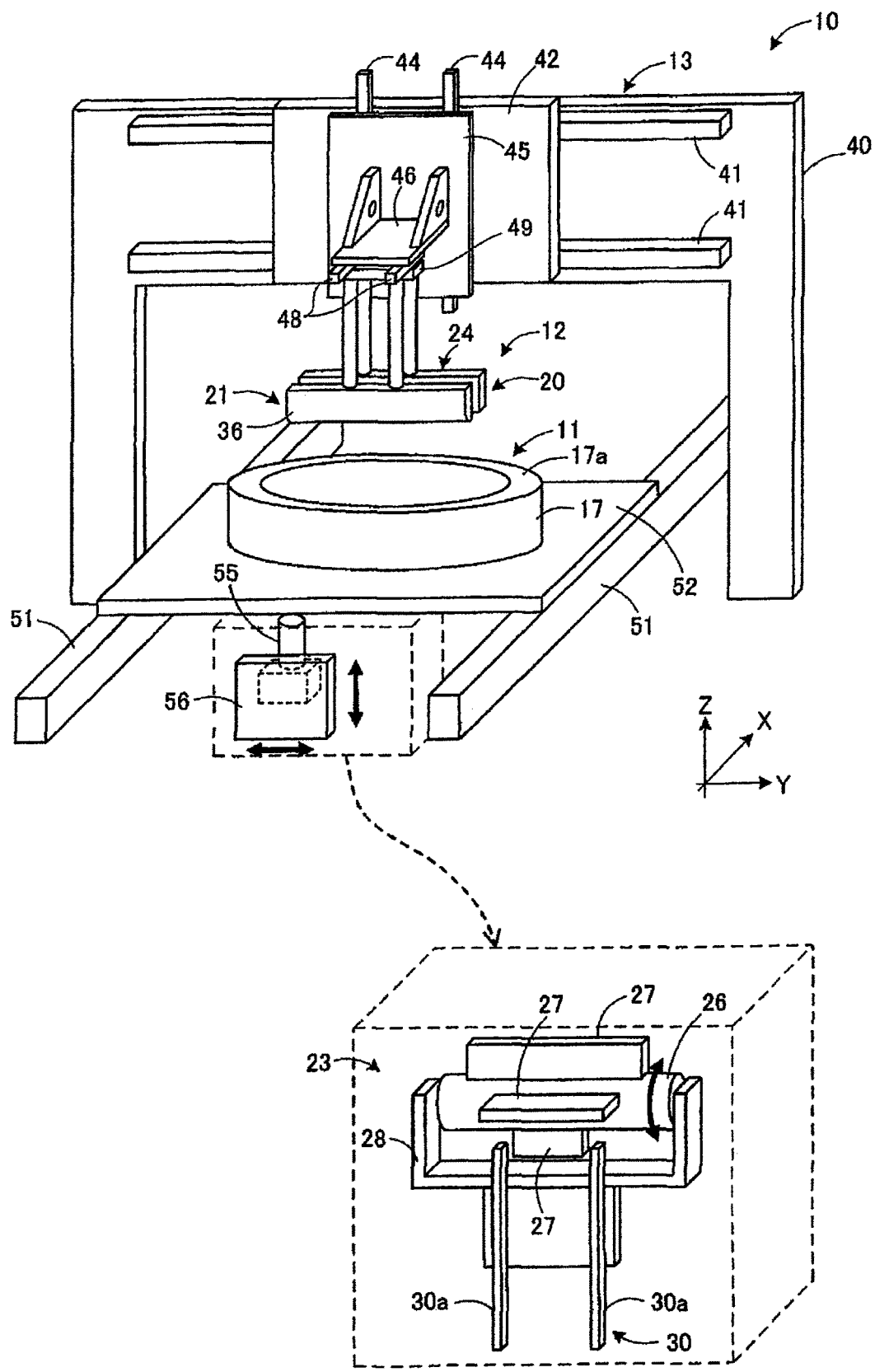
FIG. 1 is a perspective view of a dividing apparatus according to an embodiment of the present invention.

An apparatus for dividing a plate-shaped workpiece, also referred to as a dividing apparatus, according to an embodiment of the present invention will be described below with reference to the accompanying drawings. FIG. 1 illustrates in perspective the dividing apparatus according to the present invention. The dividing apparatus is not limited to structural details illustrated in FIG. 1, but may be changed or modified in appropriate ways.

As illustrated in FIG. 1, a dividing apparatus 10 is arranged to divide, with a dividing unit (dividing means) 12, a plate-shaped workpiece W supported on an annular frame F by a protective tape T into individual chips C (see FIG. 4).

Figure 2:
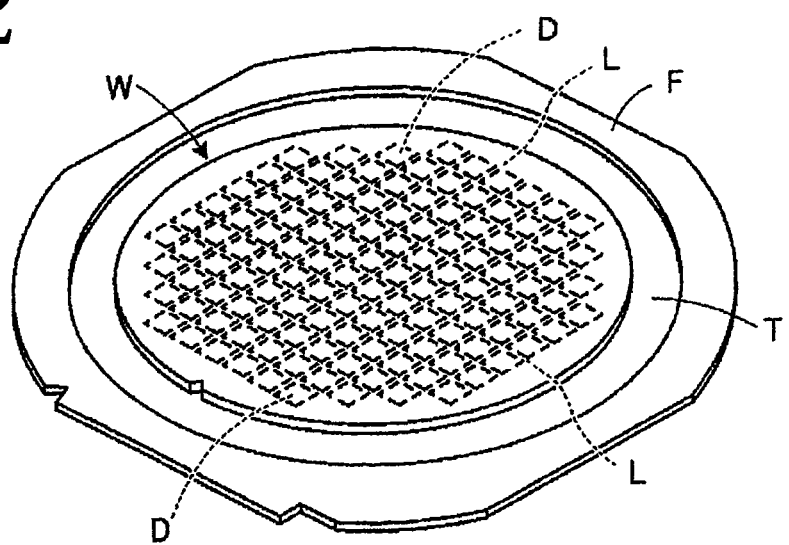
FIG. 2 is a schematic perspective view of a workpiece to be divided by the dividing apparatus according to the embodiment.

FIG. 2 illustrates in schematic perspective the workpiece W according to the present embodiment. As illustrated in FIG. 2, the workpiece W has a face side stuck to an upper surface of the protective tape T mounted on the annular frame F and is held on the annular frame F. A tape called mylar tape (not illustrated) is stuck to the reverse side of the workpiece W. The workpiece W has a grid of projected dicing lines L on the face side thereof and a plurality of devices D disposed in respective areas demarcated on the face side by the projected dicing lines L. The workpiece W may be a semiconductor wafer having a semiconductor substrate made of silicon, gallium arsenide, or the like and devices D such as integrated circuits (ICs), large scale integrated (LSI) circuits, or the like disposed thereon, or an optical device wafer having substrate made of an inorganic material of ceramics, glass, sapphire, or the like and optical devices D such as LEDs or the like disposed thereon. Alternatively, the workpiece W may be a quartz glass substrate or a sapphire substrate free of the devices D.

The workpiece W has its strength reduced along the projected dicing lines L. Such a reduction in the strength may be achieved by modified layers, not illustrated, for example, that are formed in the workpiece W as division initiating points. The modified layers refer to a region where the density, refractive index, mechanical strength, or other physical properties in the workpiece W is made different from the surrounding region by the application of a laser beam, with its strength lower than the surrounding region. The workpiece W has cracks developed therein by the modified layers formed by the application of a laser beam. According to the present embodiment, such cracks appear on the reverse side of the workpiece W opposite the projected dicing lines L, and the workpiece W is supported on the annular frame F with the reverse side facing upwardly. The modified layers represent a melted region, a cracked region, a dielectric-breakdown region, or a refractive-index-changed region, or a region where those regions occur together.

The division initiating points are not limited to modified layers, but may be any points where the workpiece W starts to be divided, and may be in the form of laser-processed grooves, cut grooves, or scribed lines, for example. The protective tape T is not limited to any materials insofar as it is elastic. The protective tape T has a tape base that is preferably made of polyolefin (PO) or polyvinyl chloride (PVC), for example.

As illustrated in FIG. 1, the dividing apparatus 10 includes a frame holding unit (frame holding means) 11, a dividing unit 12 for dividing the workpiece W into chips C (see FIG. 4) along the projected dicing lines L, and a moving mechanism (moving means) 13 for moving the frame holding unit 11 and the dividing unit 12 relatively to each other.

The frame holding unit 11 includes an annular frame holding member 17 having an upper surface as a holding surface 17a for placing the annular frame F (see FIG. 1) thereon. The frame holding member 17 is made of a magnetic material for magnetically attracting and holding the annular frame F (see FIG. 1) placed on the holding surface 17a. The frame holding unit 11 may alternatively hold the annular frame F with a plurality of clamp mechanisms disposed on the outer periphery of the frame holding member 17. The frame holding member 17 is rotatable about a central through hole defined therein by a gear 18 (see FIG. 4A, etc.) held in mesh with gear teeth on the outer periphery of the frame holding member 17.

The dividing unit 12 includes a holder 20 for holding the workpiece W by sandwiching both upper and lower surfaces thereof and a presser 21 for pressing the workpiece W in the vicinity of a portion thereof that is held by the holder 20.

The holder 20 includes a first holder 23 positioned below the frame holding member 17 and a second holder 24 positioned above the frame holding member 17.

The first holder 23 includes a rotor 26 having a central rotational axis extending in a Y-axis direction and a plurality of rectangular abutment members 27 of various lengths projecting radially and outwardly from an outer circumferential surface of the rotor 26. The rotor 26 has opposite ends supported by a bracket 28 and is rotatable about the central rotational axis by a rotating mechanism, not illustrated. The rectangular abutment members 27 have their lengths different from each other along the Y-axis direction. The directions in which the rectangular abutment members 27 project change as the rotor 26 rotates about its central rotational axis. Of the rectangular abutment members 27, the rectangular abutment member 27 that is oriented vertically and upwardly has its radially outward distal end holding the lower surface of the workpiece W. Stated otherwise, the length of the rectangular abutment member 27 that is oriented vertically and upwardly can be selected by controlling the angular displacement, i.e., rotational angle, of the rotor 26, and the selected rectangular abutment member 27 holds the workpiece W.

The first holder 23 further includes a lifting and lowering mechanism 30 having two guide rails 30a that support the bracket 28 for vertical movement. The lifting and lowering mechanism 30 has an actuating mechanism including an electric motor, a ball-screw, etc., not illustrated, for moving the bracket 28 and the rectangular abutment member 27 supported by the bracket 28 vertically in a Z-axis direction along the guide rails 30a.

Figure 3:
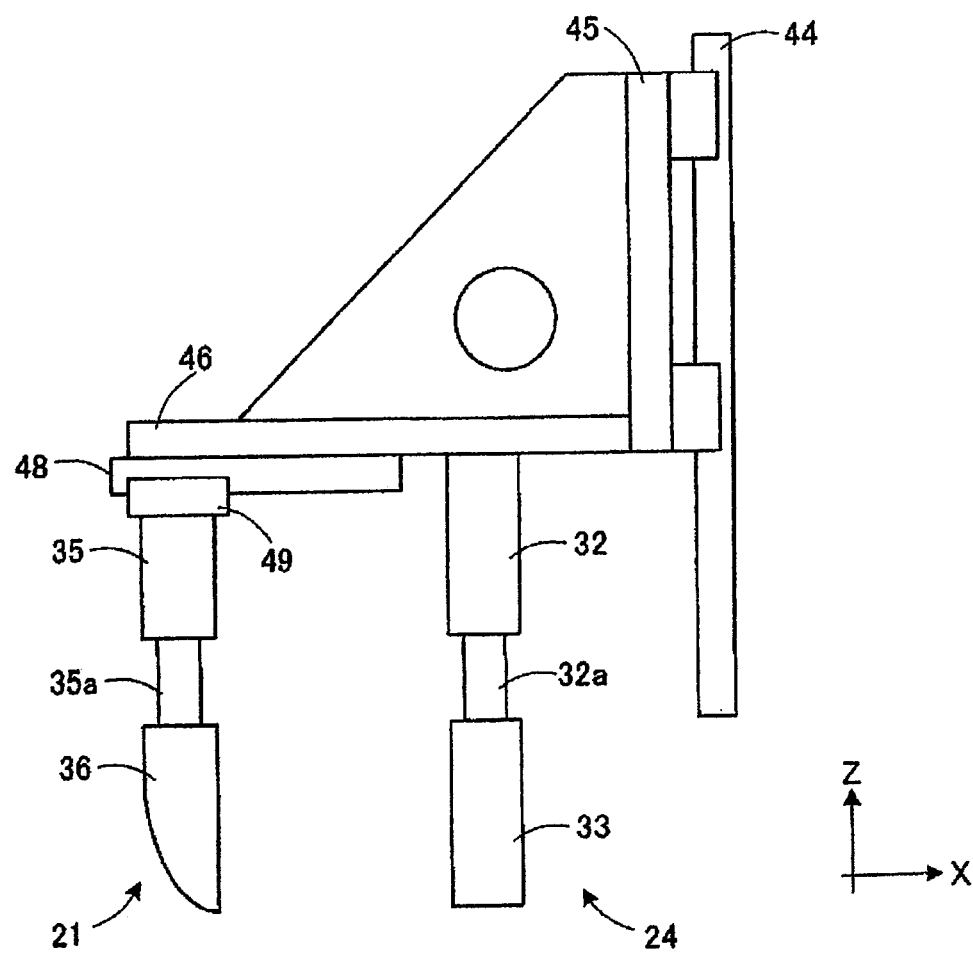
FIG. 3 is a schematic side elevational view of a second holder and a presser of the dividing apparatus according to the embodiment.

The second holder 24 is disposed in juxtaposed relation to the presser 21 in an X-axis direction and supported on a support plate 46, to be described later, of the moving mechanism 13. The second holder 24 is also disposed in juxtaposed relation to the first holder 23 in the Z-axis direction (see FIG. 4A). FIG. 3 is a schematic side elevational view of the second holder 24 and the presser 21 according to the embodiment. As illustrated in FIG. 3, the second holder 24 includes an air cylinder (advancing and retracting means) 32 hanging from a lower surface of the support plate 46 and an upper abutment member 33 connected to the lower end of a piston rod 32a of the air cylinder 32. When the air cylinder 32 is actuated, the upper abutment member 33 is vertically movable in the Z-axis direction. The upper abutment member 33 is in the form of an elongate piece or plate extending in the Y-axis direction perpendicular to the sheet of FIG. 3, and is disposed above the rectangular abutment member 27 (see FIG. 1) in facing relation thereto.

The presser 21 includes an air cylinder (advancing and retracting means) 35 extending in the Z-axis direction and a depressing member 36 connected to the lower end of a piston rod 35a of the air cylinder 35. When the air cylinder 35 is actuated, the depressing member 36 is vertically movable in the Z-axis direction. The depressing member 36 is in the form of an elongate piece or plate extending in the Y-axis direction and has its width in the X-axis direction (see FIG. 1) progressively smaller toward the lower distal end thereof.

As illustrated in FIG. 1, the moving mechanism 13 includes a portal-shaped column 40 fixedly mounted on a horizontal base, not illustrated, a pair of guide rails 41 mounted on a front surface of the column 40 and extending parallel to the Y-axis direction, and a Y-axis table 42 slidably mounted on the guide rails 41. The moving mechanism 13 also includes a pair of guide rails 44 mounted on a front surface of the Y-axis table 42 and extending parallel to the Z-axis direction, and a Z-axis table 45 slidably mounted on the guide rails 44. The moving mechanism 13 further includes a support plate 46 supported on a front surface of the Z-axis table 45 and extending parallel to an XY plane, i.e., a plane defined by the X- and Y-axis directions, a pair of guide rails 48 disposed on a lower surface of the support plate 46 and extending parallel to the X-axis direction, and a slider 49 slidably mounted on the guide rails 48. The air cylinder 32 of the second holder 24 is supported on the support plate 46, and the air cylinder 35 of the presser 21 is supported on the slider 49. The air cylinder 32 with its piston rod 32a and the air cylinder 35 with its piston rod 35a are actually provided in a pair as illustrated in FIG. 1. The Y-axis table 42, the Z-axis table 45, and the slider 49 are actuated by respective ball-screw-type actuating mechanisms, not illustrated, respectively along the guide rails 41, 44, and 48. Therefore, when the Y-axis table 42 and the Z-axis table 45 are actuated, the second holder 24 and the presser 21 are actuated in the Y-axis direction and the Z-axis direction, and when the slider 49 is actuated, the presser 21 is actuated in the X-axis direction.

The moving mechanism 13 further includes a pair of guide rails 51 parallel to the X-axis direction disposed on the base, not illustrated, on which the column 40 is fixedly mounted, and an X-axis table 52 slidably mounted on the guide rails 51. The X-axis table 52 is actuated by a ball-screw-type actuating mechanism, not illustrated, along the guide rails 51. The frame holding member 17 is mounted on an upper surface of the X-axis table 52. The X-axis table 52 has an opening defined therein (see FIG. 4A, etc.) in alignment with the central through hole in the frame holding member 17. When the X-axis table 52 is actuated, the frame holding member 17 and the workpiece W supported on the annular frame F held on the frame holding member 17 are actuated in the X-axis direction.

The dividing apparatus 10 also includes a detecting unit (detecting means) 55 for detecting, for example, one at a time of the projected dicing lines L (see FIG. 2) on the workpiece W supported by the protective tape T on the annular frame F that is held on the frame holding member 17. Since cracks developed by the modified layers appear on the reverse side of the workpiece W opposite the projected dicing lines L, and the workpiece W is supported on the annular frame F with the reverse side facing upwardly, the detecting unit 55 detects the projected dicing lines L from below the workpiece W. The detecting unit 55 includes an optical system and an image capturing device such as a charge-coupled device (CCD) or the like, not illustrated, and is mounted on a mount plate 56 lying parallel to an YZ plane, i.e., a plane defined by the Y- and Z-axis directions. As indicated by the arrows in FIG. 1, the mount plate 56 is actuatable in the Y-axis direction and the Z-axis direction for adjusting the position of the detecting unit 55 with respect to the workpiece W held on the frame holding member 17. If the workpiece W is made of silicon or the like, the detecting unit 55 may be an infrared camera that can capture infrared rays that are transmitted through the workpiece W.

Figure 4A:
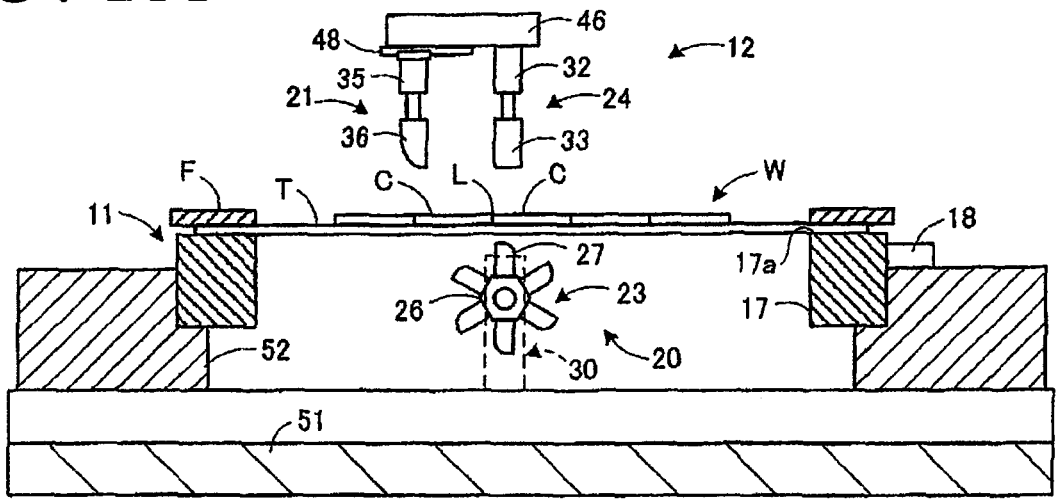
FIG. 4A is a side elevational view, partly in cross section, illustrating the manner in which the dividing apparatus is ready to divide the workpiece.
Figure 4B:
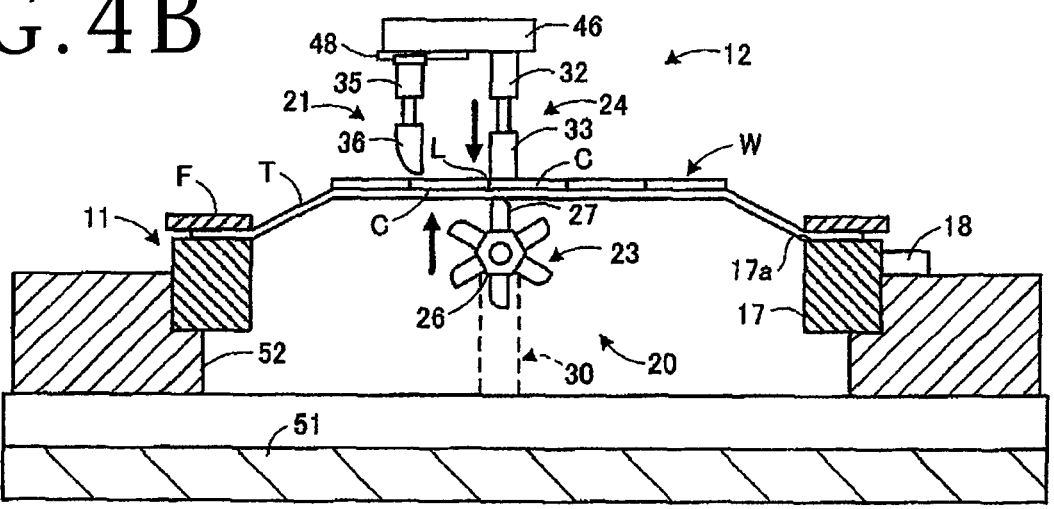
FIG. 4B is a side elevational view, partly in cross section, illustrating the manner in which the dividing apparatus is holding the workpiece.
Figure 4C:
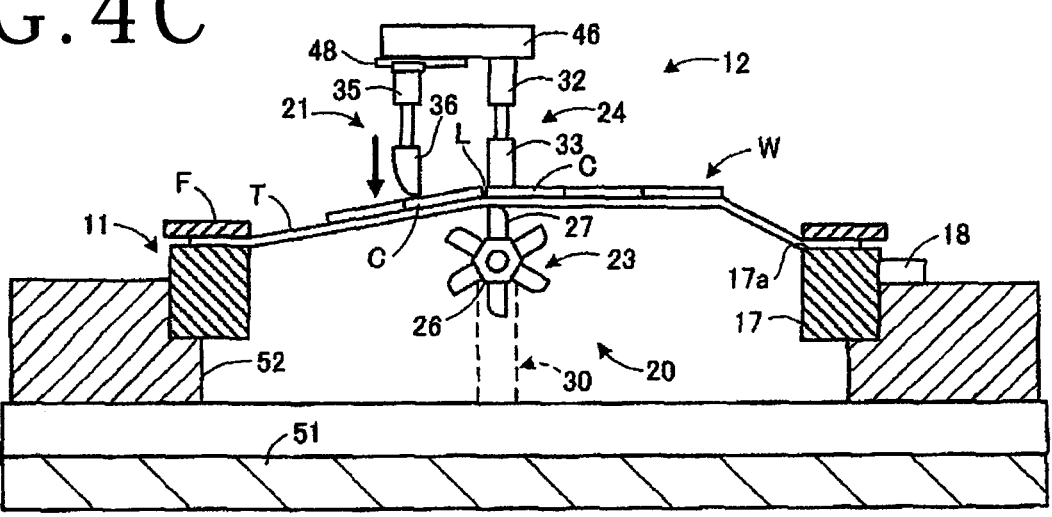
FIG. 4C is a side elevational view, partly in cross section, illustrating the manner in which the dividing apparatus is dividing the workpiece.

A process of dividing the workpiece W using the dividing apparatus 10 according to the present embodiment will be described below with reference to FIGS. 4A, 4B, and 4C. FIG. 4A is a side elevational view, partly in cross section, illustrating the manner in which the dividing apparatus 10 is ready to divide the workpiece W. FIG. 4B is a side elevational view, partly in cross section, illustrating the manner in which the dividing apparatus 10 is holding the workpiece W. FIG. 4C is a side elevational view, partly in cross section, illustrating the manner in which the dividing apparatus 10 is dividing the workpiece 10.

Prior to dividing the workpiece W on the dividing apparatus 10, the workpiece W has been processed to have its strength reduced along the projected dicing lines L by a laser beam applied thereto to form continuous modified layers therein, and the like. The workpiece W is stuck to and held on the protective tape T supported on the annular frame F.

First, as illustrated in FIG. 4A, the annular frame F with the workpiece W integrally combined therewith is placed on the holding surface 17a of the frame holding member 17 and magnetically held thereon. Then, the detecting unit 55 (see FIG. 1) detects one of the projected dicing lines L on the workpiece W, and the moving mechanism 13 (see FIG. 1) is actuated to align the workpiece W in the X-axis direction and the Y-axis direction depending on the detected projected dicing lines L. The positions of the presser 21, the first holder 23, and the second holder 24 relative to the workpiece W held on the frame holding member 17 are adjusted by the alignment of the workpiece W in order to press and divide the workpiece W in the vicinity of the projected dicing line L detected by the detecting unit 55. Specifically, above the workpiece W, the presser 21 is placed in a position, i.e., a left position in FIG. 4A, on one side of the projected dicing line L detected by the detecting unit 55, and the second holder 24 is placed in a position, i.e., a right position in FIG. 4A, on the other side of the projected dicing line L. As the first holder 23 is disposed directly below the second holder 24 beneath the workpiece W, the first holder 23 and the second holder 24 are positioned in facing relation to each other across the workpiece W.

For positioning the presser 21, the presser 21 is moved along the guide rails 48 to adjust the distance from the second holder 24 to the presser 21 depending on the planar chip size of each of the chips C. Preferably, the lower distal end of the depressing member 36 of the presser 21 is positioned in the vicinity of a projected dicing line L nearest the projected dicing line L where the workpiece W is to be broken, in a direction away from the holders 23 and 24.

Figure 5A:
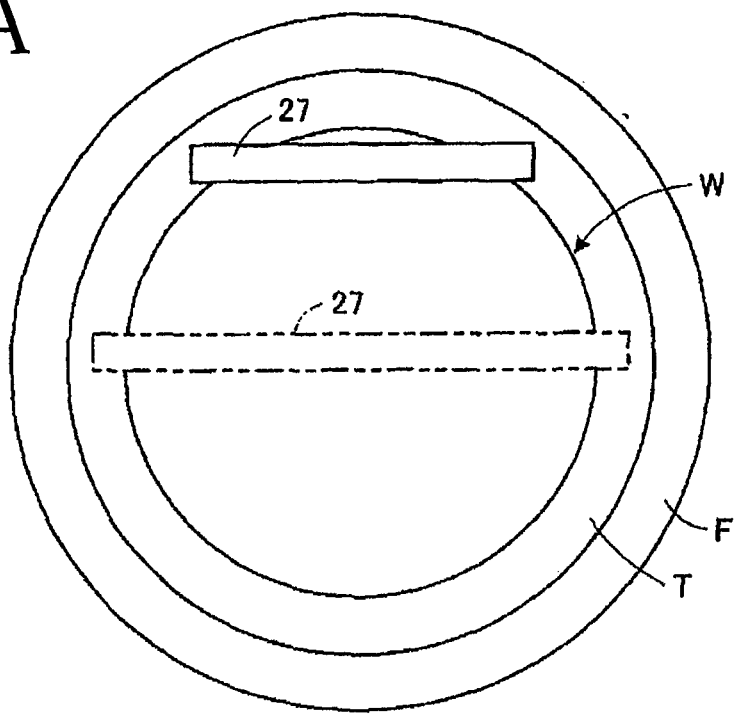
FIG. 5A is a plan view illustrating the manner in which the dividing apparatus is ready to divide the workpiece.
Figure 5B:
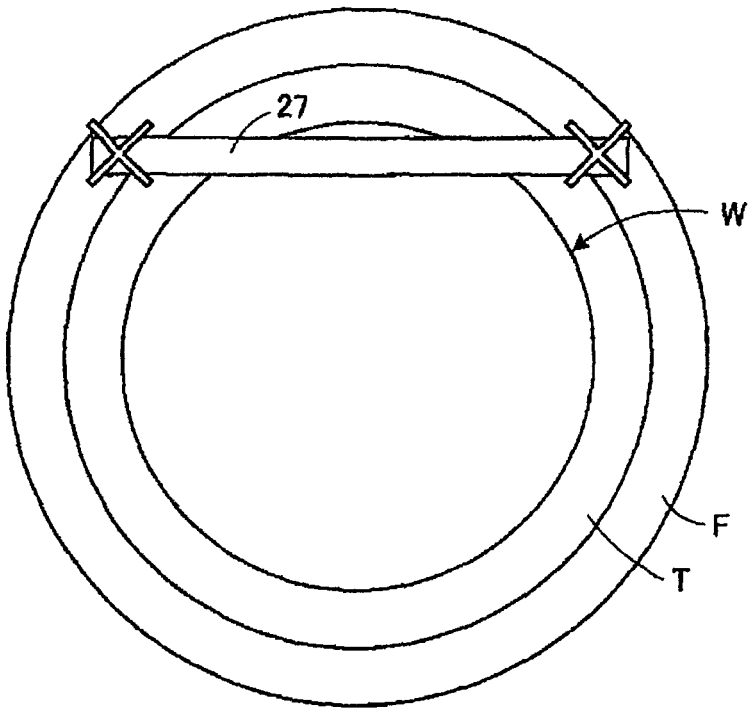
FIG. 5B is a plan view similar to FIG. 5A, illustrating a drawback of the related art.

Before and after the presser 21 is thus positioned, a control unit (control means), not illustrated, determines the length of the projected dicing line L detected by the detecting unit 55, and controls the rotor 26 to rotate so as to orient upwardly the rectangular abutment member 27 whose length corresponds to the determined length of the projected dicing line L. Specifically, the length of the rectangular abutment member 27 that is oriented upwardly by the first holder 23 is set to be larger than the length of the projected dicing line L detected by the detecting unit 55, and the opposite ends of the rectangular abutment member 27 that is oriented upwardly are set to be positioned within the annular frame F as illustrated in FIG. 5A. In this manner, the upwardly oriented rectangular abutment member 27 extends over the entire projected dicing line L along its direction and is prevented from contacting the annular frame F and hence from failing to hold the workpiece W as described later.

Thereafter, as illustrated in FIG. 4B, the lifting and lowering mechanism 30 of the first holder 23 is actuated to lift the upwardly oriented rectangular abutment member 27 toward the workpiece W. The workpiece W is pushed upwardly from the face side (lower side) thereof through the protective tape T by the rectangular abutment member 27 thus lifted, and is positioned above the upper surface of the annular frame F. The air cylinder 32 of the second holder 24 is then actuated to lower the upper abutment member 33 toward the workpiece W. The upper abutment member 33 thus lowered abuts the workpiece W from above. The upper abutment member 33 and the rectangular abutment member 27 now hold the workpiece W together by sandwiching both the upper and lower surfaces thereof in the vicinity of the projected dicing line L where the workpiece W is to be broken. In other words, one of two regions of the workpiece W that are positioned next to each other across the projected dicing line L where the workpiece W is to be broken is held by the holder 20, i.e., the first holder 23 and the second holder 24.

With the region of the workpiece W being held by the holder 20, as illustrated in FIG. 4C, the air cylinder 35 of the presser 21 is actuated to lower the depressing member 36 toward the workpiece W. The chips C that are next to the chips C held by the first holder 23 and the second holder 24 across the projected dicing line L are depressed downwardly by the depressing member 36, breaking and dividing the workpiece W along the projected dicing line L. Specifically, of the two regions of the workpiece W that are next to each other across the projected dicing line L where the workpiece W is to be broken, the other region that is not held by the holder 20, i.e., the first holder 23 and the second holder 24, is depressed by the presser 21, i.e., the depressing member 36.

After the workpiece W has been divided along the projected dicing line L, the depressing member 36 of the presser 21, the rectangular abutment member 27 of the first holder 23, and the upper abutment member 33 of the second holder 24 are retracted from the workpiece W. Then, the frame holding member 17 and the workpiece W are moved in the X-axis direction, and the workpiece W is divided again along an adjacent projected dicing line L in the same manner as described above. The workpiece W will be repeatedly divided along the remaining projected dicing lines L.

According to the present embodiment, when the presser 21 presses and divides the workpiece W, the chips C next to the projected dicing line L where the workpiece W is to be divided are held by the holder 20 on both surfaces of the workpiece W. The chips C thus held by the holder 20 are prevented from being moved by forces applied from the presser 21, and hence are prevented from producing chippings from edges thereof unlike the conventional three-point breaking process.

Furthermore, as illustrated in FIG. 4C, when the workpiece W that has been held by the holder 20 is pressed and divided by the presser 21, the chips C pressed by the presser 21 and the chips C that are next to the pressed chips C remotely from the holder 20 are tilted at the same angle. Therefore, the edges of these chips C are prevented from rubbing or abutting against each other, and hence are prevented from producing chippings. The workpiece W is thus divided neatly without producing chippings from the edge of the chips C.

In the above embodiment, the first holder 23 has a plurality of the rectangular abutment members 27 having different lengths. However, the present invention is not limited to the first holder 23 with the plural rectangular abutment members 27. The first holder 23 may have a single rectangular abutment member 27 for holding the workpiece W. Nevertheless, the illustrated embodiment is more advantageous in that the length of the rectangular abutment member 27 for holding the workpiece W can be adjusted by selecting one of the rectangular abutment members 27 having different lengths.

The illustrated shapes and structures of the rectangular abutment members 27, the upper abutment member 33, and the depressing member 36 are by way of example only, and the rectangular abutment members 27, the upper abutment member 33, and the depressing member 36 may have other shapes and structures insofar as they can perform similar functions to those according to the illustrated embodiment.

In the above embodiment, the workpiece W is divided after the projected dicing line L at the first dividing position on the workpiece W has been detected by the detecting unit 55. For dividing the workpiece W along the second and subsequent projected dicing lines L, the workpiece W may be controlled to move depending on the size of the chips C, so that the detection by the detecting unit 55 of those second and subsequent projected dicing lines L may be omitted.

In the above embodiment, the detecting unit 55 detects each of the projected dicing lines L from below the workpiece W. However, the detecting unit 55 may detect each of the projected dicing lines L from above the workpiece W. On the workpiece W, cracks may appear on the face or reverse side thereof due to the modified layers. If both cracks and the projected dicing lines L are disposed on the face side of the workpiece W, the face side of the workpiece W may be oriented to face upwardly, and the detecting unit 55 may detect each of the projected dicing lines L from above the workpiece W. Moreover, two detecting units 55 may be disposed respectively above and below the workpiece W for detecting each of the projected dicing lines L from above and below the workpiece W, and the two detecting units 55 disposed above and below the workpiece W may be selectively used depending on the relationship between the direction of the cracks and the direction of the workpiece W where the projected dicing lines L are present.

While the preferred embodiment of the present invention and the modifications thereof have been illustrated above, the embodiment and the modifications may be combined wholly or partly according to other embodiments.

The present invention is not limited to the embodiment and modifications described above, but many changes, replacements, and modifications may be made without departing from the scope of the present invention. Furthermore, the present invention may be reduced to practice according to other techniques, processes, schemes, plans, or arrangements insofar as they are capable of implementing the principles of the present invention owing to technological advances or derivations. Therefore, the scope of the appended claims should be interpreted as covering all the embodiments falling within the range of the technical idea of the present invention.

As described above, the present invention is advantageous in that when the workpiece is divided into a plurality of chips along the projected dicing lines, chippings are prevented from being produced from the edges of the chips, and is particularly useful when embodied in a dividing apparatus for dividing a workpiece into a plurality of chips.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A dividing apparatus for dividing a plate-shaped workpiece along projected dicing lines thereon, the workpiece being stuck to an upper surface of a protective tape mounted on an annular frame and having a strength reduced along the projected dicing lines, comprising:
　　a frame holding unit having a holding surface for holding the annular frame, the frame holding unit being rotatable about its own axis;
　　a detecting unit configured to detect the projected dicing lines on the workpiece stuck to the protective tape;
　　a dividing unit configured to divide the workpiece into chips along a projected dicing line among the plurality of the projected dicing lines detected by the detecting unit; and
　　a moving mechanism configured to move the frame holding unit and the dividing unit with respect to each other; wherein
　　the dividing unit includes:
　　　　a holder configured to hold one of two regions of the workpiece which are next to each other across the detected projected dicing line where the workpiece is to be broken, from both upper and lower surfaces of the workpiece, wherein the holder includes:
　　　　　　a first holder configured to push upwardly the workpiece from the lower surface thereof through the protective tape, wherein the first holder comprises a rotor and a plurality of rectangular abutment members; and
　　　　　　a second holder disposed above the workpiece in facing relation to the first holder across the workpiece, for abutting and holding the workpiece from above the workpiece; and
　　　　a presser configured to press an other of the two regions of the workpiece which is next to the one of the two regions that is held by the holder across the projected dicing line where the workpiece is to be broken, thereby to divide the workpiece along the projected dicing line.

2. A dividing apparatus for dividing a plate-shaped workpiece along projected dicing lines thereon, the workpiece being stuck to an upper surface of a protective tape mounted on an annular frame and having a strength reduced along the projected dicing lines, comprising:
　　a frame holding unit having a holding surface for holding the annular frame, the frame holding unit being rotatable about its own axis;
　　a detecting unit configured to detect the projected dicing lines on the workpiece stuck to the protective tape;
　　a dividing unit configured to divide the workpiece into chips along a projected dicing line among the plurality of the projected dicing lines detected by the detecting unit; and
　　a moving mechanism configured to move the frame holding unit and the dividing unit with respect to each other; wherein
　　the dividing unit includes:
　　　　a holder configured to hold one of two regions of the workpiece which are next to each other across the detected projected dicing line where the workpiece is to be broken, from both upper and lower surfaces of the workpiece, wherein the holder includes:
　　　　　　a first holder configured to push upwardly the workpiece from the lower surface thereof through the protective tape; and
　　　　　　a second holder disposed above the workpiece in facing relation to the first holder across the workpiece, for abutting and holding the workpiece from above the workpiece; wherein
　　　　the first holder includes a plurality of rectangular abutment members of different lengths, the first holder being operable to position one of the rectangular abutment members which has a length corresponding to the length of the projected dicing line; and
　　　　a presser configured to press an other of the two regions of the workpiece which is next to the one of the two regions that is held by the holder across the projected dicing line where the workpiece is to be broken, thereby to divide the workpiece along the projected dicing line.

3. The dividing apparatus of claim 1 wherein the abutment members have different lengths.

4. The dividing apparatus of claim 1 wherein the first holder further comprises a lifting and lowering mechanism.

5. The dividing apparatus of claim 1 wherein the second holder is supported on a support plate.

6. The dividing apparatus of claim 5 wherein the second holder further comprises an air cylinder hanging from the support plate.

7. The dividing apparatus of claim 6 wherein the second holder further comprises an upper abutment member connected to a lower end of a piston rod of the air cylinder, where the upper abutment member comprises a plate.

8. The dividing apparatus of claim 2 wherein the first holder comprises a rotor and a plurality of rectangular abutment members.

9. The dividing apparatus of claim 8 wherein the abutment members have different lengths.

10. The dividing apparatus of claim 8 wherein the first holder further comprises a lifting and lowering mechanism.

11. The dividing apparatus of claim 2 wherein the second holder is supported on a support plate.

12. The dividing apparatus of claim 11 wherein the second holder further comprises an air cylinder hanging from the support plate.

13. The dividing apparatus of claim 12 wherein the second holder further comprises an upper abutment member connected to a lower end of a piston rod of the air cylinder, where the upper abutment member comprises a plate.

* * * * *